Aug. 24, 1965 E. R. BULLOCK 3,202,884

SEMICONDUCTOR TIME DELAY CIRCUITS

Filed Sept. 12, 1962

INVENTOR:
EARL R. BULLOCK,
BY David M. Schiller
ATTORNEY.

3,202,884

SEMICONDUCTOR TIME DELAY CIRCUITS

Earl R. Bullock, Normal, Ill., assignor to General Electric Company, a corporation of New York Filed Sept. 12, 1962, Ser. No. 223,148
6 Claims. (Cl. 317—142)

Figure 1:
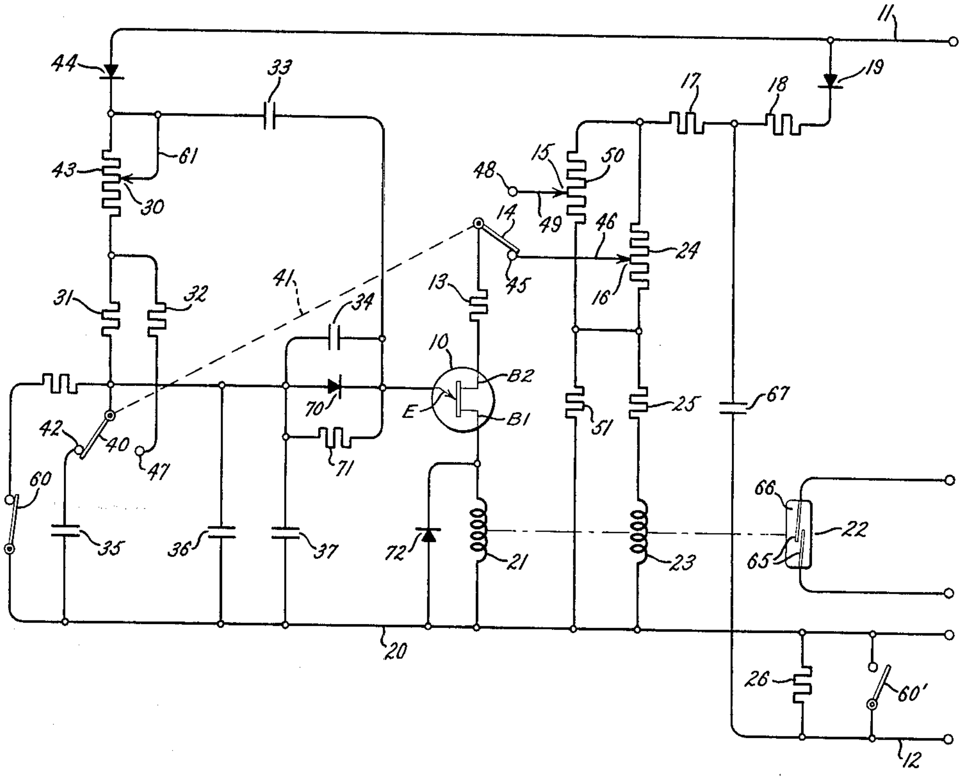

This invention relates to time delay circuits and has particular relation to time delay circuits employing semiconductor switching elements.

The unijunction transistor, because of its highly stable negative resistance characteristics, has heretofore been applied in electrical timing circuits for introducing a delay between the initiation of a signal and the response thereto. An example of a time delay circuit employing a unijunction transistor is found in U.S. Patent No. 2,780,752 issued to R. W. Aldrich et al. In time delay circuits of this type it is very desirable that provision be made for calibrating the circuit for variations in the values of the timing resistors and capacitors and also for variations in the characteristics of the transistor. The provision of such a calibration allows the use of components having wide tolerances without impairing the accuracy of the circuit.

It is also highly desirable that provision be made for permitting adjustment of the time delay afforded by the circuit and in many applications it is advantageous that the adjustment be linear so that equal increments of movement of an adjusting device are attended by equal increments of change in the time delay afforded by the circuit. Such linearity is difficult to attain inasmuch as timing circuits generally energize a load device having a fixed pick-up or response time which must be added to the variable time delay provided by the timing elements of the circuit to arrive at the overall time delay. A linear time delay adjustment is advantageous in that it allows employment of a time delay range multiplier switch.

Time delay circuits of previous design have either failed to incorporate one or more of the above-mentioned desirable features or have been of bulky, multi-part, and expensive construction.

It is therefore a primary object of this invention to provide a novel and improved semiconductor time delay circuit.

It is another object of the invention to provide a semiconductor time delay circuit having novel and improved means for calibrating for variations in the values of the timing elements and also for variations in the characteristics of the semiconductor.

It is a further object of the invention to provide a semiconductor time delay circuit having novel and improved means for effecting a linear adjustment of the time delay between the initiation of a signal and the pick-up of a load device in response to the signal.

It is still another object of the invention to provide a unijunction transistor time delay circuit which employs a minimum number of inexpensive parts and which has provision both for calibrating for variations in the values of the timing components and the characteristics of the transistor and for adjusting the time delay so that equal increments of movement of the adjusting device result in equal increments of change in the time delay afforded by the circuit.

In carrying out the invention in one preferred form there is provided a time delay circuit adapted for energization from a source of alternating voltage and designed primarily for use in timing resistance welding operations. The circuit includes a unijunction transistor having base electrodes to be connected for energization by a direct voltage and having an emitter electrode connected to an RC network to acquire a peak firing potential when the capacitor in the network is sufficiently charged. The RC network includes a substantially linear potentiometer for adjusting the time delay provided by the circuit and which includes an adjusting member rotatable over a dial which is calibrated linearly in cycles of the alternating voltage supply. The linear adjustment is permitted by a resistance in series with the potentiometer resistance and having a fixed preselected value to compensate for the fixed time required for a load device to pick-up in response to discharge of the timing capacitor through the transistor. Provision of a linear dial permits employment of a time delay range multiplier switch which operates to connect the timing capacitors and resistors in different arrangements for permitting a wide range of time delay.

The load device preferably includes a magnetic reed switch having an operating winding connected to one of the transistor bases to receive current in response to discharge of the timing capacitor. The reed switch also includes a bias winding adapted to be connected across the voltage source to receive current sufficient to hold the switch midway between its pick-up and drop-out conditions. When the operating winding is energized, the reed switch picks up and is held in the picked up condition by energization of the bias winding to provide a latching relay.

The circuit is conveniently calibrated for variations in the values of the timing components and for variations in the characteristics of the transistor by means of a potentiometer which is connected to one of the transistor bases and which is adjustable to vary the peak emitter voltage at which the transistor fires.

Figure 2:
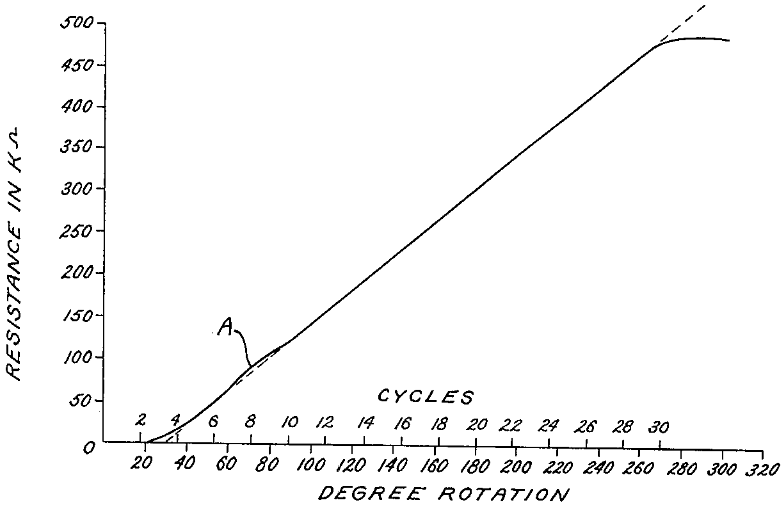

Other objects and advantages of the invention will become apparent from the following description taken in conjunction with the accompanying drawing in which:

FIGURE 1 is a schematic diagram of a unijunction transistor time delay circuit; and FIGURE 2 is a graphical representation showing the relationship between the resistance and the angular rotation of the time delay adjusting potentiometer.

Referring now to the drawing there is shown in FIGURE 1 a time delay circuit employing a unijunction transistor 10, or a double base diode as it is commonly called. The two base electrodes B1 and B2 of the transistor are connected for energization by a direct voltage derived from a source of alternating voltage represented by power leads 11 and 12 as will presently appear. In the illustrated embodiment, the base B2 is connected to the lead 11 through a resistor 13, a movable contact 14 of a two position time delay range multiplier switch, a selected one of two calibrating potentiometers 15 and 16, resistors 17 and 18, and a diode 19. The base B1 is connected to a lead 20 through an operating winding 21 of a suitable load device shown in the form of a reed switch relay including a magnetic reed switch 22 having also a bias winding 23 connected in series with the resistor 24 of potentiometer 16 and a resistor 25. The lead 20 is connected to the power lead 12 through a resistor 26. The control potential for the emitter E of the transistor is supplied from an RC network including a time delay adjusting potentiometer 30, fixed value resistors 31 and 32, and capacitors 33–37.

The range multiplier switch is employed in accord with the present invention to permit multiplication of the time scale by a suitable factor, such as ten, and for this purpose may be switched between a high range position as illustrated in the drawing and a low range position. In addition to the movable contact 14 the range switch includes also a movable contact 40 mechanically connected to the contact 14 as indicated by the dash lines 41, the contacts 14 and 40 being connected to an actuator (not shown) for movement as a unit. When the range selector switch is in its illustrated high range position, the contact 40 engages a terminal 42 and a first timing circuit is established which includes in series the parallel connected capacitors 35, 36 and 37, the resistor 31, and the resistor 43 of the potentiometer 30. The parallel-connected capacitors 35–37 are charged through an adjustable portion of the resistor 43, the resistor 31, and a diode 44 from the power leads 11 and 12. For the high range position, the movable contact 14 engages a terminal 45 connected to an adjustable tap 46 in sliding contact with the resistor 24 of the calibrating potentiometer 16.

When the range selector switch is actuated to its low range position, the contact 40 is moved out of engagement with the terminal 42 into engagement with the terminal 47 which is connected to the lower end of transistor 32. This establishes a second timing circuit which includes the parallel-connected capacitors 36 and 37 in series with the parallel-connected resistors 31 and 32 and in series with the resistor 43 and the diode 44. At the same time the contact 14 is moved out of engagement with the terminal 45 into engagement with a terminal 48 connected to an adjustable tap 49 in sliding contact with a resistor 50 which forms part of the calibrating potentiometer 15 and which is connected in series with a resistor 51 having its lower end connected to the lead 20.

As will presently appear, the calibrating potentiometers 15 and 16 permit variation of the peak emitter potential of the transistor 10 at which the transistor fires to thereby effect calibration for variations in values of the timing circuit components and for variations in the characteristics of the transistor. As will be more fully described hereinafter, the potentiometer 30 permits adjustment of the time delay provided by the circuit.

The time delay is initiated such as by opening a switch 60, which shunts the capacitors 35–37, and thereafter shorting out resistor 26 by closing a switch 60′. The time delay is terminated when the reed switch 22 picks up in response to firing of the transistor 10, the firing of the transistor occurring when the capacitors 35–37 become charged to a voltage which is equal to the peak voltage between the emitter E and the base B1 at which the transistor fires. The capacitor discharge current flows through the emitter E and the base B1 to energize the operating winding 21 of the reed switch relay which picks up the switch 22.

In accord with the present invention means are provided to calibrate the circuit to permit the use of timing components having wide tolerances without impairing the accuracy of the circuit. The calibrating means permits calibration for variations in the values of the timing components and also for variations in the characteristics of the transistor. In the illustrated embodiment, the calibrating means comprises the two potentiometers 15 and 16, one for each position of the range selector switch, and these potentiometers are effective to permit variation of the interbase voltage of the transistor to thereby permit changes in the peak emitter voltage at which the transistor fires. It can be demonstrated that by proper selection of the values of resistors 24, 25, 50, and 51 the time delay of the circuit is a function of the positions of the taps 46 and 49 on the resistors 24 and 50 respectively. For this purpose the values of the potentiometer resistors 24 and 50 should be selected to be considerably less than the series resistance of the resistor 13 and the resistance between the transistor bases B1 and B2. This is explained by considering that for the low range the time delay is the time required for the paralleled capacitors 36 and 37 to charge to a voltage $V_p$ which is the peak emitter voltage of transistor 10 at which the transistor fires. The method of calibration is to change the value of $V_p$ and this is done by changing the position of tap 49. The time delay T is represented as follows:

$$(1) \qquad T=RC\ \ln\left(\frac{V_1}{V_1-V_p}\right)$$

where:

R=the resistance of the parallel combination of resistors 31 and 32 plus the resistance of the potentiometer 30, $C$=the capacitance of the parallel combination of capacitors 36 and 37, and $V_1$=the rectified voltage applied to the time delay circuit The peak emitter voltage $V_p$ is represented by the following equation:

$$(2) \qquad V_p=nV_{BB}+V_D$$

where:

$n$=the intrinsic standoff ratio, $V_{BB}$=the interbase voltage, and $V_D$=a diode voltage drop in the transistor By proper selection of the resistor 13, the peak emitter voltage $V_p$ can be expressed as:

$$(3) \qquad V_p=nV_2$$

where:

$V_2$=the voltage at the upper terminal of resistor 13

By choosing the resistance of resistor 50 to be considerably less than the series resistance of the resistor 13 and the resistance between the bases $B_1$ and $B_2$, $V_2$ can be expressed as:

$$(4) \qquad V_2=BV_1$$

where:

$B$=the calibration factor defined by the position of the tap 49 on resistor 50

Substituting for $V_2$ in Equation 3 we obtain:

$$(5) \qquad V_p=nBV_1$$

Substituting for $V_p$ in Equation 1 we obtain:

$$(6) \qquad T=RC\ \ln\left(\frac{V_1}{V_1-nBV_1}\right)$$

$$(7) \qquad =RC\ \ln\left(\frac{1}{1-nB}\right)$$

Thus, the factor B can be varied by changing the position of tap 49 to correct for variations in R, C, and the intrinsic standoff ratio $n$.

In the present invention the potentiometer 30 permits adjustment of the time delay provided by the circuit by permitting variation of the charging current supplied to the timing capacitors 35–37. For this purpose the potentiometer 30 includes a tap 61 which is in sliding contact with the potentiometer resistor 43 and which is connected between the upper end of the resistor 43 and the lower end of the diode 44. The tap 61 is preferably in the form of a rotatable contact which is rotatable over a dial (not shown) calibrated in numbers of cycles of the alternating voltage applied to the leads 11 and 12. Thus, the dial (not shown) may have numerals 3–30 spaced angularly thereabout and representing a low range of three to thirty cycles time delay. When the range switch is in its high range position, the numerals 3–30 on the dial represent thirty to three hundred cycles time delay.

In many applications it is highly desirable that a linear dial be provided wherein the cycle-indicating numerals on the dial (not shown) are equally spaced to indicate equal increments of time delay. Time delay circuits of previous design have not contained a linear time dial due mainly to the fact that the overall time delay provided by the circuit includes a fixed time which is the time required to pick up the load relay or the load relay and a device driven thereby.

In the present invention means are provided which permit provision of a linear time dial in spite of the fixed time required to pick-up the load relay, or the relay and a device driven thereby, so that equal increments of rotation of the tap 61 will provide equal increments of change of the time delay of the circuit. The provision of a linear time dial is very desirable in that it permits utilization of the range multiplier switch to give accurate time delays over a considerable range. It will be demonstrated hereinafter that a linear time dial is obtainable over a specific time range, such as three to thirty cycles, by selecting the potentiometer 30 to have a linear characteristic over a portion of the range of rotation of the tap 61, and by selecting the resistors 31 and 32 so that the resistor 31 on the high range and the parallel combination of the resistors 31 and 32 on the low range has a value equal to the product of the slope of the potentiometer in ohms per cycle and the difference between the electrical zero of the potentiometer in cycles and the fixed time of the circuit provided by the pick-up time of the load relay, or of the relay and a device driven thereby, also in cycles.

FIG. 2 is a graphical representation illustrating the relationship between the resistance of the potentiometer resistor 43 (ordinate) and the angular position of the tap 61 (abscissa). This relationship is depicted by the curve A which is observed to be linear over its intermediate portion but which deviates from such linearity at its extremities. The electrical zero of the potentiometer 30 is the angular position of the tap 61 which would provide zero resistance of the resistor 43 if the potentiometer were perfectly linear. To ascertain the electrical zero of potentiometer 30, the linear portion of the curve A is extended to intersect the abscissa or zero resistance line, and in the particular embodiment shown, the electrical zero is at approximately thirty degrees of rotation of the tap 61.

The low range time scale is also shown in FIG. 2 along the abscissa and it is observed that a change in the angular position of the tap 61 of nine degrees produces a change in the time delay of one cycle for the low position of the range switch throughout the range of three to thirty cycles. The electrical zero of the potentiometer 30 on the time scale is approximately three and one-quarter cycles.

In order to determine the value of resistor 31 on the high range and the value of the parallel combination of resistors 31 and 32 on the low range which permits a linear time dial it is necessary to ascertain the slope of the potentiometer 30. This can readily be found from the graph of FIG. 2, the slope of the potentiometer at its linear portion being about eighteen thousand ohms per cycle on the low range time scale. It is also necessary to determine the fixed time required for the reed switch to pick up subsequent to firing of the transistor. In the present example it is assumed that this fixed time is about one and one-quarter cycles on the time scale. The procedure for calculating the value of the parallel combination of resistors 31 and 32 for the low range scale shown in FIG. 2 will now be described.

Equation 7 can be rewritten to include the fixed pick-up time of the relay as follows:

(8) $$T=kRC+T_1$$

where:

$$k=\ln\left(\frac{1}{1-nB}\right)$$

$T_1$=the fixed pick-up time of the relay

Equation 8 can be rewritten as follows:

(9) $$T=K(R_{43}+R_s)+T_1$$

where:

$K=kc$ $R_{43}$=the resistance of the potentiometer resistor 43

$R_s$=the resistance of the parallel combination of resistors 31 and 32

Equation 9 shows that the time T varies with a variation of resistance $R_{43}$. Assuming a perfect linear potentiometer, its resistance $R_{43}$ will increase linearly by a factor S, where S is the slope in ohms per unit of time. Therefore, the resistance $R_{43}$ at any time setting is expressed as follows:

(10) $$R_{43}=S(Ts-T_2)$$

where:

$T_2$=the electrical zero of the potentiometer in time units $Ts$=a selected setting of the tap 61 in time units Substituting for $R_{43}$ in Equation 9 we obtain:

(11) $$T=K[S(Ts-T_2)+Rs]+T_1$$

Since $T=Ts$ for the true condition, if we now select two exact time settings such as 20 and 10 time units on the low range, and substitute each in Equation 11, we obtain:

(12) $$20=K[S(20-T_2)+Rs]+T_1$$

(13) $$10=K[S(10-T_2)+Rs]+T_1$$

Subtracting Equation 13 from Equation 12 we can solve for the constant K for the true condition as follows:

Subtracting:

(14) $$10=10KS$$

or

(15) $$K=\frac{1}{S}$$

Substituting for K in Equation 11 we obtain:

(16) $$T=\frac{1}{S}\left[S(Ts-T_2)+Rs\right]+T_1$$

or

(17) $$T=Ts-T_2+\frac{Rs}{S}+T_1$$

Since for the true condition $T=Ts$,

(18) $$Rs=S(T_2-T_1)$$

It is thus seen that $Rs$ or the resistance of the parallel combination of resistors 31 and 32, required for potentiometer 30 and for the particular time scale shown is equal to the product of the slope of the potentiometer and the differential between the fixed pick-up time of the relay and the electrical zero of the potentiometer. In the particular example under discussion the value of $Rs$ is:

$$Rs=18{,}000\text{ ohms }(3\tfrac{1}{4}-1\tfrac{1}{4})=36{,}000\text{ ohms}$$

The value of resistor 31 ($R_{31}$) for the high range and for the potentiometer 30 and for the same pick-up time of the load is:

$$R_{31}=1{,}800\text{ ohms }(32.5-1.25)=56{,}250\text{ ohms}$$

The reed switch 22 includes a pair of magnetic reed contacts 65 which are mounted in overlapping relation within a sealed tube 66 in normally open condition as illustrated. Contacts 65 are closed and the switch picked up in response to the production of a magnetic flux which traverses the contacts 65 and which is produced by energization of the operating winding 21 in response to firing of the transistor 10. The bias winding 23 is effective so that when energized from the alternating voltage on leads 11 and 12, a biasing flux is produced thereby which maintains the contacts 65 substantially midway between the pick-up and drop-out points of the switch 22. When winding 21 is energized, the contacts 65 are picked up and are held in the picked-up condition by energization of the winding 23 subsequent to deenergization of the winding 21. A capacitor 67 includes terminals connected respectively to a point between resistors 17 and 18 and to the lead 12, the capacitor 67 serving to furnish bias current for the bias coil 23 and serving also to supply a reference voltage for the transistor 10.

In operation, the range switch is initially set to provide the desired range of cycles on the time scale, such as the high range thirty to three hundred cycles as illustrated. The tap 61 is next set to provide the time delay desired. The switch 60 is then opened and the switch 60′ thereafter closed with the result that the capacitors 35–37 receive a step charge through the diode 44, the potentiometer 30 and the resistor 31. Due to the ripple in the reference voltage across capacitor 67 the step charge may not be sufficient to assure firing the transistor during a positive half cycle of the alternating voltage supply, and therefore the capacitors 33 and 34 are provided to form a voltage divider network to place a voltage pulse on top of the charge on capacitors 35–37. A diode 70 is connected between the upper terminals of the timing capacitors 35–37 and the emitter E of the transistor to furnish a low impedance discharge path for the timing capacitors. A resistor 71 is connected to shunt the diode 70 and the capacitor 34 to prevent leakage current from the transistor from charging the capacitor 34.

After the lapse of a preselected time as determined by the setting of the tap 61 on resistor 43, the capacitors 35–37 discharge through the emitter E of the transistor and the base B1 thereof and through the operating winding 21 of the reed switch relay. The winding 21 is thus energized to produce a magnetic flux effective to close the contacts 65 and pick up the reed switch 22, the reed switch 22 remaining in its picked up condition by flux produced by energization of the winding 23 subsequent to reduction of the capacitor discharge current to zero. A diode 72 is connected to shunt the winding 21 to commutate the field generated by energization of such winding. The values of resistors 25 and 51 are selected to provide the proper bias current for the bias coil 23. The value of resistor 26 is selected to maintain a small charge on the timing capacitors 35–37 so that these capacitors will more nearly start charging at the same level regardless of the amount of reset time between timing cycles.

While I have shown and described particular embodiments of my invention, it will be obvious to those skilled in the art that various changes and modifications may be made without departing from my invention in its broader aspects and I, therefore, intend in the appended claims to cover all such changes and modifications as fall within the true spirit and scope of my invention.

What I claim as new and desire to secure by Letters Patent of the United States is:

1. In combination, a unijunction transistor having an emitter electrode and a pair of base electrodes, said base electrodes being adapted for connection across a source of electric potential, a timing circuit including in series a substantially linear potentiometer and a capacitor to be connected across the source of potential so that the capacitor is charged through an adjustable portion of the potentiometer from the source, said capacitor being connected across the emitter electrode and one of said base electrodes to apply a potential to said emitter electrode, said capacitor discharging through said emitter electrode and said one base electrode when the capacitor is charged to the peak potential of said emitter electrode at which the transistor fires, a load device responsive to the discharge current of said capacitor, and fixed resistor means in series with said potentiometer and having a value equal to the product of the slope of the potentiometer in ohms per unit of time and the differential of the electrical zero of the potentiometer in time units and the pick up time of said load device.

2. In combination, a unijunction transistor having an emitter electrode and a pair of base electrodes, a base circuit including said base electrodes adapted for connection across a source of electrical potential, a timing circuit including in series a first substantially linear potentiometer and a capacitor to be connected across the source of potential so that the capacitor is charged through an adjustable portion of the first potentiometer from the source, said capacitor being connected across the emitter electrode and one of said base electrodes to apply a potential to said emitter electrode, said capacitor discharging through said emitter electrode and said one base electrode when the capacitor is charged to the peak potential of said emitter electrode at which the transistor fires, a load device responsive to the discharge current of said capacitor, fixed resistor means in series with said first potentiometer and having a value equal to the product of the slope of the first potentiometer in ohms per unit of time and the differential of the electrical zero of the first potentiometer in time units and the pick-up time of said load device, and a second potentiometer connected to said base circuit to permit variation of the peak emitter potential at which the transistor fires.

3. In combination, a unijunction transitor having an emitter electrode and a pair of base electrodes, said base electrodes being adapted for connection across a source of electric potential, a timing circuit including in series a first resistor and a capacitor to be connected across the source of potential so that the capacitor is charged through the first resistor from the source, said capacitor being connected across the emitter electrode and one of said base electrodes to apply a potential to said emitter electrode, said capacitor discharging through said emitter electrode and said one base electrode when the capacitor is charged to the peak potential of said emitter electrode at which said transistor fires, a load device responsive to the discharge current of said capacitor, a second resistor to be connected across said source of potential, an adjustable tap in sliding contact with said second resistor, and a third resistor having terminals connected respectively to said adjustable tap and to said other base electrode, said second resistor having a resistance value which is less than the sum of the resistance values of said third resistor and of the resistance between said base electrodes.

4. In combination, a unijunction transistor having an emitter electrode and a pair of base electrodes, a base circuit including said base electrodes adapted for connection across a source of electrical potential, a timing circuit including in series a first substantially linear potentiometer and a capacitor to be connected across the source of potential so that the capacitor is charged through an adjustable portion of the first potentiometer from the source, said capacitor being connected across the emitter electrode and one of said base electrodes to apply a potential to said emitter electrode, said capacitor discharging through said emitter electrode and said one base electrode when the capacitor is charged to the peak potential of said emitter electrode at which the transistor fires, a load device responsive to the discharge current of said capacitor, fixed resistor means in series with said first potentiometer and having a value equal to the product of the slope of the first potentiometer in ohms per unit of time and the differential of the electrical zero of the first potentiometer in time units and the pick up time of said load device, and a second potentiometer connected to said base circuit to permit variation of the peak emitter potential at which the transistor fires, said load device including a normally open magnetic reed switch, a bias winding for said switch to be connected for energization from said sourse to maintain the switch midway between the pick up and drop out points thereof, and an operating winding for the switch connected to said one base electrode to pick up the switch when the transistor fires, said bias winding holding the switch in its picked up condition.

5. In combination, a unijunction transistor having an emitter electrode and a pair of base electrodes, said base electrodes being adapted for connection across a source of electric potential, a timing circuit to be connected across said source including a substantially linear potentiometer, a plurality of capacitors to be connected in a selected one of two different arrangements in series with said potentiometer so that the selected capacitor arrangement is charged through an adjustable portion of the potentiometer from the source, said selected capacitor arrangement being connected across the emitter electrode and one of said base electrodes to apply a potential to said emitter electrode, and to discharge through said emitter electrode and said one base electrode when charged to the peak potential of said emitter electrode at which the transistor fires, and a plurality of resistors to be connected in a selected one of two different arrangements in series with said potentiometer, a load device responsive to the discharge current of said selected capacitor arrangement, each said selected resistor arrangement having a value equal to the product of the slope of the potentiometer in ohms per unit of time and the differential of the electrical zero of the potentiometer in time units and the pick up time of said load device and a time delay range multiplier switch movable betwen low and high range positions wherein the switch respectively connects said resistors and said capacitors in said different arrangements.

6. In combination, a unijunction transistor having an emitter electrode and a pair of base electrodes, said base electrodes being adapted for connection across a source of electric potential, a timing circuit including in series a first resistor and a capacitor to be connected across the source of potential so that the capacitor is charged through the first resistor from the source, said capacitor being connected across the emitter electrode and one of said base electrodes to apply a potential to said emitter electrode, said capacitor discharging through said emitter electrode and said one base electrode when the capacitor is charged to the peak potential of said emitter electrode at which said transistor fires, a load device responsive to the discharge current of said capacitor, a second resistor to be connected across said source of potential, an adjustable tap in sliding contact with said second resistor, and a third resistor having terminals connected respectively to said adjustable tap and to said other base electrode, said second resistor having a resistance value which is less than the sum of the resistance values of said third resistor and of the resistance between said base electrodes, said load device including a normally open magnetic reed switch, a bias winding for said switch connected for energization from said source to maintain the switch midway between the pick up and drop out points thereof, and an operating winding for the switch connected to said one base electrode to pick up the switch when the transistor fires, said biasing winding holding the switch in its picked up condition.

References Cited by the Examiner

UNITED STATES PATENTS

| | | | |
|---|---|---|---|
| 2,769,926 | 11/56 | Lesk | 317—148.52 |
| 3,047,745 | 7/62 | Frank | 317—148.55 |
| 3,099,758 | 7/63 | Pieczynski | 317—148.55 |
| 3,109,964 | 11/63 | Winchel | 317—148.55 |

SAMUEL BERNSTEIN, *Primary Examiner.*